United States Patent
Hezar et al.

(10) Patent No.: US 12,154,992 B2
(45) Date of Patent: Nov. 26, 2024

(54) PHOTODIODE INTEGRATED WITH CIRCUIT

(71) Applicant: TEXAS INSTRUMENTS INCORPORATED, Dallas, TX (US)

(72) Inventors: Rahmi Hezar, Allen, TX (US); Henry Litzmann Edwards, Garland, TX (US); Miaad Aliroteh, Milpitas, CA (US); Srinath Mathur Ramaswamy, Murphy, TX (US); Baher Haroun, Allen, TX (US); Gerd Schuppener, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 578 days.

(21) Appl. No.: 17/402,287

(22) Filed: Aug. 13, 2021

(65) Prior Publication Data
US 2023/0049751 A1 Feb. 16, 2023

(51) Int. Cl.
*H01L 31/02* (2006.01)
*G01S 7/4861* (2020.01)
*H01L 31/107* (2006.01)

(52) U.S. Cl.
CPC ...... *H01L 31/02027* (2013.01); *G01S 7/4861* (2013.01); *H01L 31/107* (2013.01)

(58) Field of Classification Search
CPC .................. H01L 31/02027; H01L 27/1463
See application file for complete search history.

(56) References Cited

U.S. PATENT DOCUMENTS

| | | | |
|---|---|---|---|
| 11,530,947 B1* | 12/2022 | Moore | ........................ G01J 1/44 |
| 2019/0252442 A1 | 8/2019 | Tanaka et al. | |
| 2020/0212854 A1 | 7/2020 | Seyed Aliroteh et al. | |
| 2021/0028202 A1* | 1/2021 | Inoue | ..................... H01L 31/107 |
| 2021/0159257 A1 | 5/2021 | Moussy et al. | |
| 2021/0175376 A1 | 6/2021 | Borthakur | |
| 2021/0175380 A1* | 6/2021 | Borthakur | ................ G02B 3/06 |

FOREIGN PATENT DOCUMENTS

EP    3553824 A1    10/2019

OTHER PUBLICATIONS

International Search Report for PCT/US2022/040295 dated Nov. 21, 2022; 4 pages.
International Searching Authority, Written Opinion for PCT/US2022/040295 dated Nov. 21, 2022; 4 pages.

* cited by examiner

*Primary Examiner* — Tony Ko
(74) *Attorney, Agent, or Firm* — Frank D. Cimino (57) ABSTRACT

A sensor chip includes a sensor pixel. The sensor pixel includes an avalanche photodetector. A circuit is adjacent to the avalanche photodetector. The circuit is coupled to the avalanche photodetector. An isolation structure at least partially encloses the circuit and is between the avalanche photodetector and the circuit.

22 Claims, 6 Drawing Sheets

PHOTODIODE INTEGRATED WITH CIRCUIT

BACKGROUND

Optical sensors are used in many applications, including vehicle navigation systems, security systems, robotics, and manufacturing automation. Optical sensors generally operate by detecting optical light and generating an electrical signal according to the detected light. In a light-detection-and-ranging (LiDAR) system, optical sensors are used for detecting reflected light, and distance from objects to the system is determined according to the reflected light.

SUMMARY

In one example, a sensor chip includes a sensor pixel. The sensor pixel includes an avalanche photodetector. A circuit is adjacent to the avalanche photodetector. The circuit is coupled to the avalanche photodetector. An isolation structure at least partially encloses the circuit and is between the avalanche photodetector and the circuit.

In another example, an optical sensing system includes a sensor chip. The sensor chip includes a sensor pixel. An optical signal source generates optical signals. A lens focuses reflected optical signals onto the sensor chip. A signal processing module is coupled to the sensor chip and the optical signal source. The sensor pixel includes an avalanche photodetector. A circuit is adjacent to the avalanche photodetector. The circuit is coupled to the avalanche photodetector. An isolation structure at least partially encloses the circuit and is between the avalanche photodetector and the circuit.

In another example, a sensor chip includes a sensor array. The sensor array includes sensor pixels in multiple columns and multiple rows. Each of the sensor pixels includes an avalanche photodetector. A circuit is adjacent to the avalanche photodetector. The circuit is coupled to the avalanche photodetector. An isolation structure at least partially encloses the circuit and is between the avalanche photodetector and the circuit.

BRIEF DESCRIPTION OF THE DRAWINGS

For a detailed description of various examples, reference will now be made to the accompanying drawings in which.

DETAILED DESCRIPTION

The described examples include a sensor chip of a semiconductor substrate including a higher-voltage photodiode, a lower-voltage circuit, and an isolation structure formed in semiconductor materials and between the higher-voltage photodiode and the lower-voltage circuit, where the voltage for the higher-voltage photodiode is higher than the voltage for the lower-voltage circuit. In one example, a bias voltage for the higher-voltage photodiode is in a range of approximately negative 30 volts to negative 50 volts, and a bias voltage for the lower-voltage circuit is in a range of approximately 1.5 volts to 3.3 volts. The isolation structure is between the higher-voltage photodiode and the lower-voltage circuit, to reduce the risk of the voltage of the higher-voltage photodiode interfering with the operation of the lower-voltage circuit. Accordingly, in one example the higher-voltage photodiode and a lower-voltage circuit are integrated in the sensor chip, e.g., in a pixel of the sensor chip. The higher-voltage photodiode is an avalanche photodiode (APD). The lower-voltage circuit may include a preamplifier. The described examples include an optical sensing system having a sensor chip that includes a higher-voltage photodiode, a lower-voltage circuit, and an isolation structure. The optical sensing system may be a light-detection-and-ranging (LiDAR) system.

Figure 1:
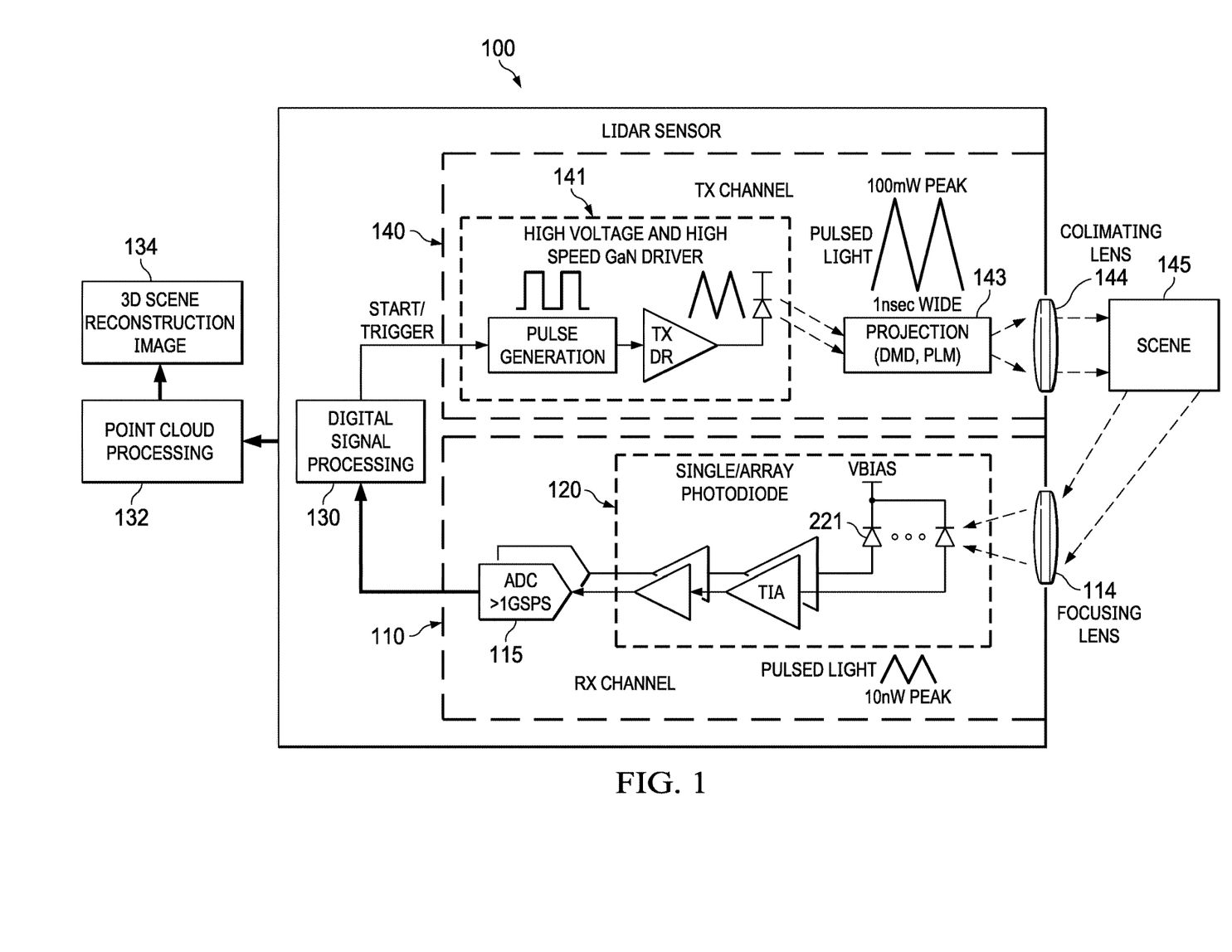
FIG. 1 illustrates a block diagram for an example of an optical sensing system in accordance with the disclosure.

FIG. 1 shows a block diagram for an example of an optical sensing system 100 in accordance with this disclosure. The optical sensing system 100 includes a transmitting (TX) channel 140 configured to provide optical signals to a scene 145 (e.g., one or more objects), a receiving (RX) channel 110 configured to receive and convert the reflected optical signals to electrical signals, and processing modules including a digital signal processing module 130 and a point cloud processing module 132.

Implementations of the optical sensing system 100 may be applied in automotive LiDAR or other optical sensing applications. The transmitting (TX) channel 140 includes an optical signal source 141, a micro-electromechanical system (MEMS) light projection device 143, e.g., a digital micromirror device (DMD) or a phase spatial light modulator (PLM), and a collimating lens 144. The optical signal source 141 may be a laser pulse generator that includes a laser diode, a driver circuit, a pulse generation circuit, and/or other optical signal generation circuitry. Optical signals produced by the optical signal source 141 are provided or sent to the scene 145 via the light projection device 143 and the collimating lens 144.

Optical signals reflected by the scene 145 are sensed by the receiving (RX) channel 110 of the optical sensing system 100. The receiving (RX) channel 110 includes a focusing lens 114, a sensor chip 120, one or more analog-to-digital converters (ADCs) 115. The reflected optical signals are focused by the focusing lens 114 onto the sensor chip 120. The sensor chip 120 may be a semiconductor chip that detects and converts the reflected optical signals to electrical signals. The sensor chip 120 can include a higher-voltage APD 221 and a lower-voltage circuit to detect and convert the reflected optical signals. In certain examples, the sensor chip 120 includes an array of higher-voltage APDs 221, and each higher-voltage APD 221 has a lower-voltage transimpedance amplifier (TIA) circuit. By integrating the lower-voltage circuits with the higher-voltage APDs 221 in the sensor chip 120, the interconnect parasitics, such as bondwire inductance and electrostatic-discharge (ESD) capacitance, can be reduced or prevented, and a higher bandwidth (resolution) thus can be achieved. The sensor chip 120 can process the electrical signals by the lower-voltage circuit therein, and provide analog electrical signals to the analog-to-digital converters 115.

The analog-to-digital converters 115 are configured to convert the analog electrical signals to digital signals and provide the digital signals to the signal processing module 130 for further processing. The digital signal processing module 130 is coupled to the sensor chip 120 via the analog-to-digital converters, and is coupled to the optical signal source 141. The digital signal processing module 130 is configured to control the optical signal source 141 to produce optical signals and process digital signals received from the analog-to-digital converters 115 to generate data for the point cloud processing module 132. The point cloud processing module 132 is configured to reconstruct or generate, according to the data from the digital signal processing module 130, a three-dimensional (3D) scene reconstruction image 134 that represents the scene 145 sensed by the optical sensing system 100.

Figure 2:
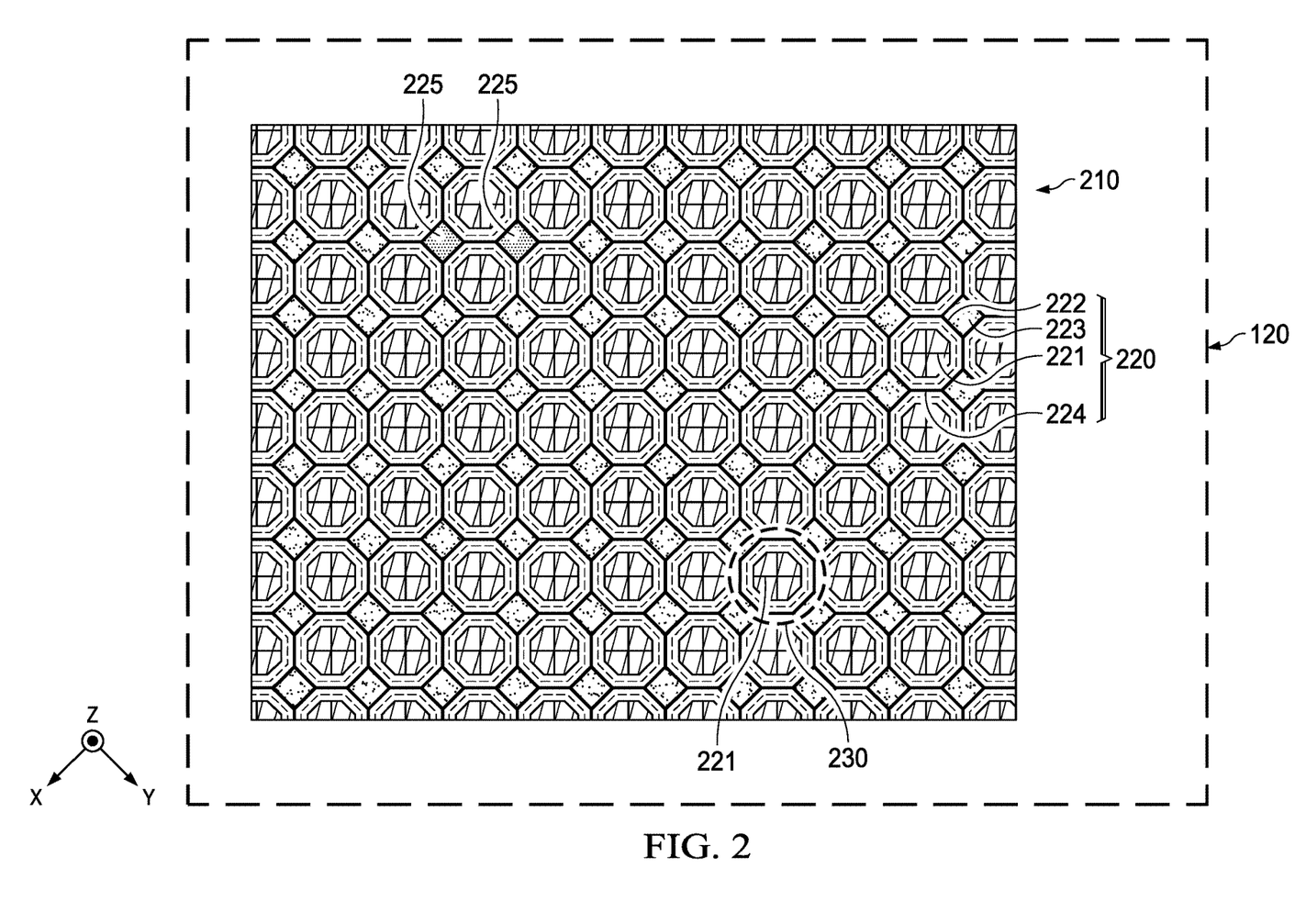
FIG. 2 illustrates a schematic diagram of an example of a sensor chip in accordance with the disclosure.

FIG. 2 illustrates a schematic diagram of an example of a sensor chip in accordance with the disclosure. Referring to FIG. 2, the sensor chip 120 includes a sensor array 210, and the sensor array 210 includes sensor pixels 220. Each sensor pixel 220 includes an APD 221, an in-pixel circuit 223, and an isolation structure 222, such as a junction-isolation structure or an n-tank structure. The isolation structure 222 is between the APD 221 and the in-pixel circuit 223. The isolation structure 222 shields the in-pixel circuit 223 from the APD 221 in the same pixel and the APDs 221 in the adjacent sensor pixels 220. The sensor pixel 220 further includes one or more isolation structures 224 between the APDs 221 in the adjacent sensor pixels 220 to reduce cross-talk between the APDs 221 in the adjacent sensor pixels 220.

In some examples, a sensor pixel 220 includes an optical shield 225 over the in-pixel circuit 223. Although only two optical shields 225 are shown in FIG. 2, each sensor pixel 220 may include an optical shield 225 over the in-pixel circuit 223 of the sensor pixel 220. The optical shield 225 may be a metal layer over the in-pixel circuit 223 to provide optical shielding to the in-pixel circuit 223.

By integrating the in-pixel circuit 223 with the APDs 221 in the sensor chip 120, the interconnect parasitics, such as bond-wire inductance and electrostatic-discharge (ESD) capacitance, can be reduced or prevented, and a higher bandwidth (resolution) thus can be achieved. Further, apertures of single APDs may be reduced, e.g., to a dimension close to or less than the dimension of a laser spot from a target reflection, such that APDs capture less background light noise while capturing the laser spot from a target reflection. Accordingly, the signal-to-noise ratio (SNR) can be increased.

In the example of FIG. 2, for a laser spot 230 from a target reflection, the aperture of corresponding APD 221 on which the laser spot 230 lands on is smaller than or close to the dimension of the laser spot 230. Accordingly, the corresponding APD 221 is exposed to less ambient light noise when detecting signals from the laser spot 230 as compared to an APD that has an aperture much larger than a laser spot that lands on the APD. Thus, a higher SNR can be obtained for APD 221 having the aperture smaller than or close to the laser spot 230 in dimensions.

In the example of FIG. 2, the sensor chip 120 includes a sensor array 210 that has multiple rows of sensor pixels 220 and multiple columns of sensor pixels 220. In other examples, the sensor chip includes a sensor array that has only a single row of sensor pixels or a single column of sensor pixels. That is, in those examples, the sensor chip includes only a single row of sensor pixels or a single column of sensor pixels. The sensor array and the sensor pixel can have any geometric shapes. The technical advance is not limited to the geometric shapes disclosed.

Figure 3:
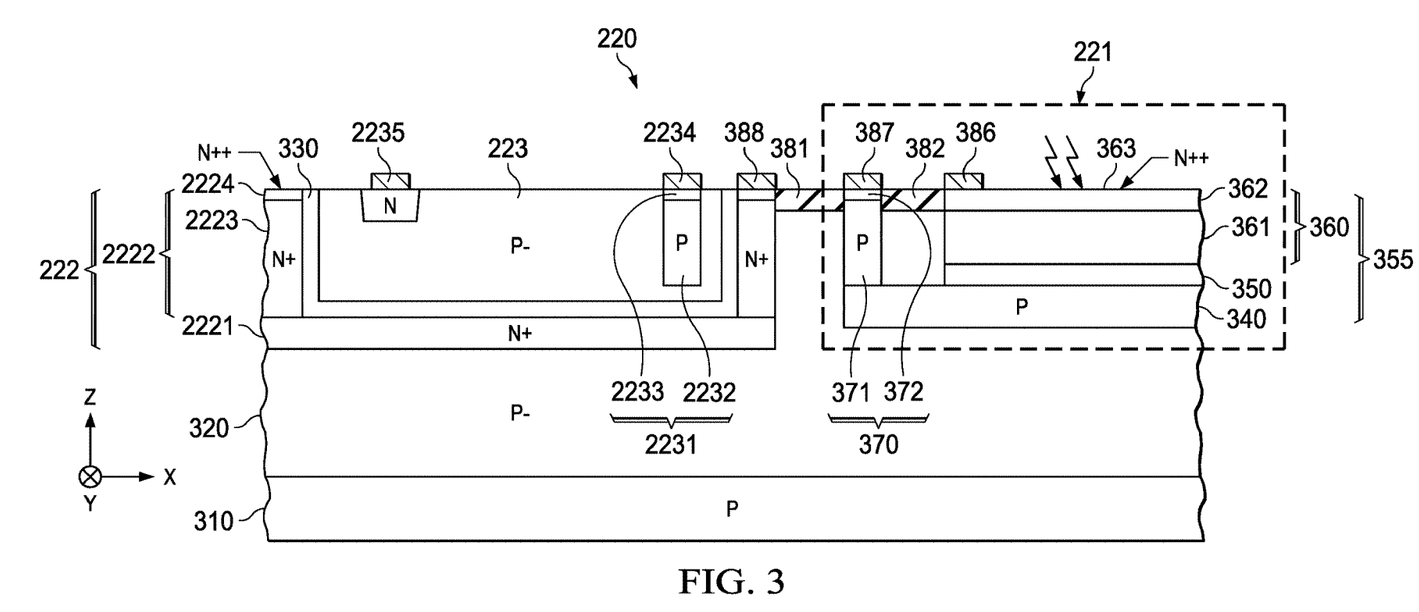
FIG. 3 illustrates a schematic view of an example of a sensor pixel in accordance with the disclosure.

FIG. 3 illustrates a schematic view of an example of a sensor pixel in accordance with the disclosure. In this example, the sensor pixel 220 includes a substrate 310, a semiconductor layer 320, an APD 221 formed in the semiconductor layer 320, an in-pixel circuit 223, and an isolation structure 222 between the APD 221 and the in-pixel circuit 223. The isolation structure 222 shields the in-pixel circuit 223 from the APD 221 in the sensor pixel 220 to reduce the risk of the higher voltage of the APD 221 interfering with the operation of the in-pixel circuit 223.

The sensor chip may include p-type semiconductor and n-type semiconductor at various doping levels. A p-type semiconductor is a semiconductor doped with electron acceptor impurities. A doping level of a p-type semiconductor may be a P− doping level, a P doping level, a P+ doping level, or a P++ doping level, where the P− doping level<the P doping level<the P+ doping level<the P++ doping level. In some examples, the P− doping level has a value less than $3 \times 10^{16}$ cm$^{-3}$, and the P++ doping level has a value greater than $3 \times 10^{19}$ cm$^{-3}$. An n-type semiconductor is a semiconductor doped with electron donor impurities. A doping level of a n-type semiconductor may be an N− doping level, an N doping level, an N+ doping level, or an N++ doping level, where the N− doping level<the N doping level<the N+ doping level<the N++ doping level. In some examples, the N− doping level has a value less than $3 \times 10^{16}$ cm$^{-3}$, and the N++ doping level have a value greater than $3 \times 10^{19}$ cm$^{-3}$.

In the example of FIG. 3, the substrate 310 is a p-type semiconductor substrate, i.e., a substrate including a p-type semiconductor at, e.g., at a P doping level; and the semiconductor layer 320 includes a p-type semiconductor at a P− doping level such as that in the range specified above.

In the example of FIG. 3, the APD 221 includes a p-type semiconductor layer 340, a n-type semiconductor layer 360, and an avalanche layer 350 between the p-type semiconductor layer 340 and the n-type semiconductor layer 360; and the n-type semiconductor layer 360 includes an n-type semiconductor layer 361 at an N doping level and an n-type semiconductor layer 362 at an N++ doping level. In the example of FIG. 3, The p-type semiconductor layer 340 is at a P doping level. As the n-type semiconductor layer 360 and p-type semiconductor layer 340 are together to form a p-n junction 355, a depletion layer of the p-n junction 355 is formed at the boundary of the n-type semiconductor layer 360 and p-type semiconductor layer 340. The avalanche layer 350 may be the depletion layer of the p-n junction 355 or a portion of the depletion layer of the p-n junction 355.

In the example of FIG. 3, the APD 221 further includes a contact 386 on the n-type semiconductor layer 360, and the contact 386 may be configured to receive a voltage from, e.g., a voltage generator, and provide the voltage to the n-type semiconductor layer 362. In one example, the voltage is 0 volts (i.e., ground). The APD 221 further includes a p-type terminal 370 and a contact 387 on the p-type terminal 370. The p-type terminal 370 includes a p-type terminal 371 and a p-type terminal 372. The contact 387 may be configured to receive a voltage from, e.g., a voltage generator, and provide the voltage to p-type terminal 370. The p-type terminal 370 is in contact with the p-type semiconductor layer 340.

By providing a voltage (e.g., in a range of approximately negative 30 volts to negative 50 volts) to the p-type terminal 370 via the contact 387 and providing a voltage (e.g., 0 volts) to the n-type semiconductor layer 362 via the contact 386, the APD 221 may be under a bias voltage, e.g., in a range of approximately negative 30 volts to negative 50 volts. The bias voltage generates an electrical field in the APD 221. Photons absorbed by the APD 221 generate carriers, such as electrons and holes. The carriers may be accelerated by the electrical field to excite more carriers, resulting in avalanche carrier multiplication in the avalanche layer 350.

By the avalanche carrier multiplication effect, the sensitivity of the APD 221 may be increased. The APD 221 may be a higher-voltage APD that includes the avalanche layer 350 deep below a surface 363 of the APD 221. The higher-voltage of the APD 221 may enhance the avalanche carrier multiplication effect, and accordingly, increase current gain of the APD 221. Accordingly, the performance of the APD 221 can be increased.

The in-pixel circuit 223 may include a semiconductor layer 330. The semiconductor layer 330 may include p-type semiconductor at a P− doping level. The in-pixel circuit 223 may further include a preamplifier (not shown in FIG. 3). The preamplifier may include one or more transistors such as a p-channel metal-oxide-semiconductor field-effect transistor (MOSFET) or an n-channel MOSFET that can be fabricated using complementary metal-oxide-semiconductor (COMS) or Bipolar CMOS (BiCMOS) processes, or any other suitable circuit elements. The in-pixel circuit 223 may include various electrical circuits according to any particular application. The in-pixel circuit 223 may include amplifiers, filters, converters, and/or other components to process the signals received from the APD 221.

In the example of FIG. 3, the in-pixel circuit 223 further includes or is coupled to a contact 2235 configured to receive a first circuit voltage and provide the first circuit voltage to the in-pixel circuit 223 via an n-type well; and the in-pixel circuit 223 further includes or is coupled to a contact 2234 configured to receive a second circuit voltage and provide the second circuit voltage to the in-pixel circuit 223. The contact 2234 is in contact with a p-type terminal 2231, and the p-type terminal 2231 includes a p-type terminal 2232 and a p-type terminal 2233. The p-type terminal 2231 is in contact with the semiconductor layer 330 or a p-type well in the semiconductor layer 330. The contact 2234 may provide the second circuit voltage to the in-pixel circuit 223 via the p-type terminal 2231 and the semiconductor layer 330. The second circuit voltage may be 0 Volts, serving as a ground voltage. The first circuit voltage may be a voltage in a range of approximately 1.5V to 3.3V. In the example of FIG. 3, the semiconductor layer 320 and the background doping in the in-pixel circuit 223 have P− doping levels. In other examples, other suitable doping levels can be chosen for the semiconductor layer 320 and the background doping in the in-pixel circuit 223.

The in-pixel circuit 223 may be coupled through a metallization layer or other means to the APD 221 to receive signals from the APD 221. Further, the isolation structure 222 shields the in-pixel circuit 223 from the APD 221 to reduce the interference from the APD 221 to the in-pixel circuit 223, where the APD 221 operates at a higher voltage than the in-pixel circuit 223. The isolation structure 222 include a base 2221 and a wall 2222 on the base 2221. The base 2221 may include an n-type semiconductor, such as n-type silicon. The wall 2222 may include an n-type semiconductor, such as an n-type silicon. In the example of FIG. 3, the wall 2222 includes a first wall portion 2223 and a second wall portion 2224, and a contact 388 is in contact with the wall 2222 and couples the isolation structure 222 to a ground terminal or a voltage terminal that provides an elevated voltage (not shown in FIG. 3). In one example, the base 2221 has an N doping level, an N+ doping level, or an N++ doping level. In some examples, the wall 2222 has an N doping level, an N+ doping level, or an N++ doping level. The base 2221 and the wall 2222 can have same or different doping levels. In certain examples, the base 2221 has an N doping level, and the wall 2222 has an N+ doping level.

FIGS. 2 and 3 also illustrates a coordinate system comprising X, Y, and Z. The X-axis and the Y-axis are orthogonal to each other and are parallel to a plane of the substrate 310. The X and Y-axes are thus referred to as being in the "in-plane direction." The Z-axis is perpendicular to the X and Y-axes and thus perpendicular to a plane of substrate 310. Referring to FIGS. 2 and 3, a cross-section of the wall 2222 of the isolation structure 222 across a plane (i.e. X-Y plane) parallel to the substrate 310 of the sensor pixel 220 may have a diamond shape (i.e., a rhombus shape). In certain examples, a cross-section of the wall 2222 of the isolation structure 222 across a plane (i.e. X-Y plane) parallel to the substrate 310 of the sensor pixel 220 has a rectangle shape. In some examples, a cross-section of the wall 2222 of a first isolation structure 222 across a plane (i.e. X-Y plane) parallel to the substrate 310 of the sensor pixel 220 has a diamond shape, and a cross-section of the wall 2222 of a second isolation structure 222 across a plane (i.e. X-Y plane) parallel to the substrate 310 of the sensor pixel 220 has a rectangle shape. In some examples, a cross-section of the wall 2222 of the isolation structure 222 across a plane (i.e. X-Y plane) parallel to the substrate 310 of the sensor pixel 220 has a square shape. A cross-section of the APD 221 or an aperture of the APD 221 across a plane parallel to the substrate 310 of the sensor pixel 220 may have a octagon shape having at least one side facing toward the wall 222. In one example, referring to FIG. 2, a cross-section of the APD 221 has an octagon shape, and the octagon shape has four sides facing towards four in-pixel circuits 223 adjacent to the APD 221 and four sides facing towards APDs 221 adjacent to the APD 221. In some examples, a cross-section of the APD 221 has a rectangular shape or a square shape. In certain examples, a cross-section of the APD 221 has a rectangle shape with chamfered corners, sides of the rectangle have dimensions in a range of 2 μm to 1000 μm, and the chamfers have dimensions in a range of 2 μm to 50 μm and are chosen to prevent or reduce high field effects at corners of the APD 221.

A shape of the wall 222 is not limited to the above-described example shape, and various shapes may be selected for the wall 222 according to actual needs. A shape of the APD 221 and/or an aperture of the APD 221 is not limited to the above-described example shape. Various shapes may be selected for the APD 221 and/or the aperture of the APD 221 according to actual needs.

Referring to FIG. 3, the sensor pixel 220 further includes isolating components 381 and 382. In some examples, an isolating component is a shallow-trench-isolation (STI) structure. In certain examples, an isolating component is an oxide structure of or by local oxidation of silicon (LOCOS). The Isolating components can reduce electrical current leakage and breakdown between components due to electrical fields therebetween. The Isolating component 382 can reduce electrical current leakage and breakdown between the p-type terminal 370 and the n-type semiconductor layer 360 due to electrical fields between the p-type terminal 370 and the n-type semiconductor layer 360.

In one example, the semiconductor layers include silicon layers. In another example, the semiconductor layers include germanium layers, and/or semiconductor layers including compound semiconductors. Various semiconductors may be selected for the semiconductor layers according to actual needs.

The above-described doping types of the structures in the sensor pixel 220 are merely for illustrative purposes, and are not intended to limit the scope of the present disclosure. Doping types of the structures in the sensor pixel 220 may be selected according to various application scenarios. Different doping types may be selected for the structures in the sensor pixel 220. In one example, the substrate 310 is a substrate of a p-type semiconductor, the semiconductor layer 320 includes a p-type semiconductor, and the APD 221 includes a p-type semiconductor layer 340 and a n-type semiconductor layer 360. In another example, the doping types of some or all of the structures may be selected as different types or opposite types. The substrate may be a substrate of a n-type semiconductor, the semiconductor layer corresponding to the semiconductor layer 320 may include an n-type semiconductor, and the semiconductor layer corresponding to the semiconductor layer 340 may be chosen as an n-type semiconductor layer, and the semiconductor layer corresponding to the semiconductor layer 360 may be chosen as a p-type semiconductor layer.

Various doping types (e.g., p-type, n-type, undoped-type) and/or doping levels of structures of the sensor pixel 220 may be chosen according to application scenarios. In some examples, such as the examples of FIG. 3, the substrate 310 is at a P doping level, the semiconductor layer 320 is at a P− doping level, the p-type semiconductor layer 340 is at a P doping level, the n-type semiconductor layer 361 is at an N doping level, the n-type semiconductor layer 362 is at an N+ doping level, terminals 371 and 2232 are at P doping levels, terminals 372 and 2233 are at P++ doping levels (not shown in FIG. 3), and the base 2221, the first wall portion 2223 of the isolation structure 222 are at an N+ doping level, and the second wall portion 2224, the terminal 372, and the semiconductor layer 362 are at an N++ doping level. However, other suitable doping types and doping levels may be chosen for structures of the sensor pixel 220 according to various application scenarios.

In one example, the contact 387 and 2234 are configured to receive negative voltages and provide the negative voltages to the p-type terminals 370 and 2231, respectively; the contact 386 is configured to receive a positive voltage, a voltage of zero volts, or a negative voltage that has a smaller magnitude than the negative voltage received by the contact 387, so as to obtain a negative bias voltage for the APD 221; the substrate 310 and the semiconductor layers 320 and 330 are each at a negative voltage; and the isolation structure 222 is coupled to a ground terminal via the contact 388. In another example, the contact 387 and 2234 are coupled to a ground terminal, and accordingly the p-type terminals 370 and 2231 are grounded; the contact 386 is configured to receive a positive voltage, so as to obtain a negative bias voltage for the APD 221; the substrate 310 and the semiconductor layers 320 and 330 are grounded; and the contact 388 is configured to receive a positive voltage and provide the positive voltage to the isolation structure 222.

In some examples, the semiconductor layers 320 and 330 are formed by epitaxial growth and/or ion implantation; the p-n junction 355, the terminals 370, 2231, and the isolation structure 222 are formed by ion implantations with donor or acceptor impurities in the semiconductor layers 320 and 330; contacts 386, 287, 388, 2234 and 2235 are formed by deposition on the semiconductor layers 320 and 330; and the Isolating components 381 and 382 are formed by etching portions of the semiconductor layer 320 to form trenches and filling the trenches with oxide materials.

Figure 4:
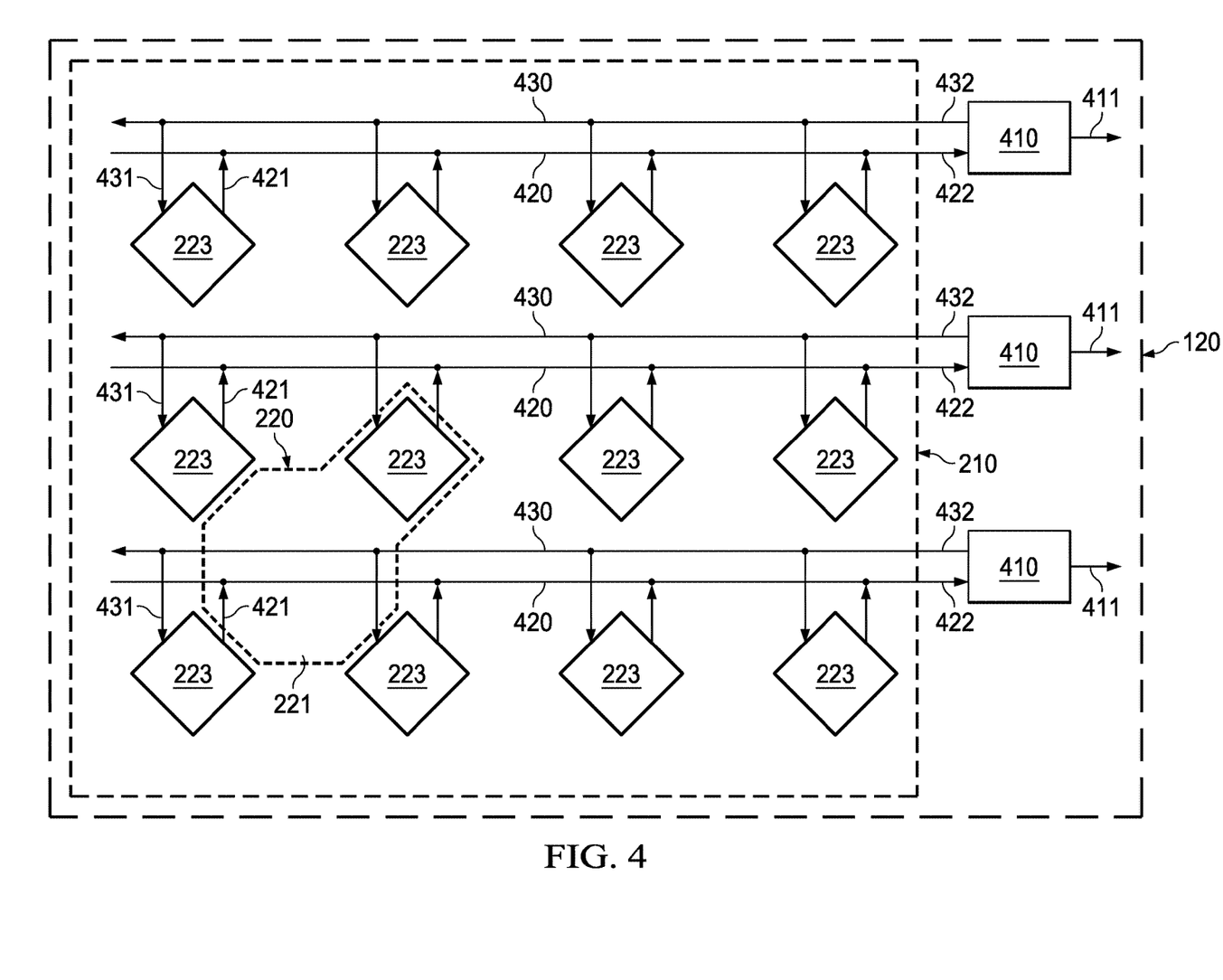
FIG. 4 illustrates another schematic diagram of an example of a sensor chip including circuits in accordance with the disclosure.

FIG. 4 illustrates another schematic diagram of an example of a sensor chip including circuits in accordance with the disclosure. The sensor chip 120 includes a sensor array 210. The sensor array 210 includes sensor pixels 220. For clear illustrations, only one of the sensor pixels 220 is specifically shown and labeled in FIG. 4. Each sensor pixel 220 includes an APD 221 and an in-pixel circuit 223. In the example of FIG. 4, the sensor chip 120 further includes out-of-pixel circuits 410, which are outside a sensor pixel 220 or the sensor array 210, but still in a same chip 120 as the APDs 221.

Multiple in-pixel circuits 223 of each row are coupled to an out-of-pixel circuit 410. For example, multiple in-pixel circuits 223 in the first row are coupled to an out-of-pixel circuit 410 for the first row; multiple in-pixel circuits 223 in the second row are coupled to an out-of-pixel circuit 410 for the second row; and multiple in-pixel circuits 223 in the third row are coupled to an out-of-pixel circuit 410 for the third row. Multiple in-pixel circuits 223 of each row may be coupled to an out-of-pixel circuit 410 via one or more output bus lines 420, or one or more input bus lines 430. In each row, the outputs 421 of the in-pixel circuits 223 are coupled to an input 422 of the out-of-pixel circuit 410, and provide signals to the input 422 of the out-of-pixel circuit 410 via the output bus line 420.

In each row, the output 432 of the out-of-pixel circuit 410 may be coupled to an input 431 of each of the in-pixel circuits 223 via one or more input bus line 430, and provide signals to the input 431 of each of the in-pixel circuits 223. The output 411 of each of the out-of-pixel circuits 410 may be coupled to additional circuits (not shown in FIG. 4) for further signal processing.

In the example of FIG. 4, in each row, the outputs 421 of the in-pixel circuits 223 can be current outputs, the in-pixel circuits 223 are in parallel, and the respective out-of-pixel circuits 410 obtain total current outputs of the outputs 421 and convert the total current outputs to a voltage, and output the voltage via the respective output 411. In other examples, in each row, the outputs 421 of the in-pixel circuits 223 can be voltage outputs, and the respective out-of-pixel circuit 410 obtains total voltage outputs of the outputs 421 and converts the total voltage outputs to a voltage, and outputs the voltage via the respective output 411. For example, in each row, the in-pixel circuits 223 are arranged or coupled in series, such that the respective out-of-pixel circuit 410 obtains total voltage outputs of the outputs 421.

Figure 5:
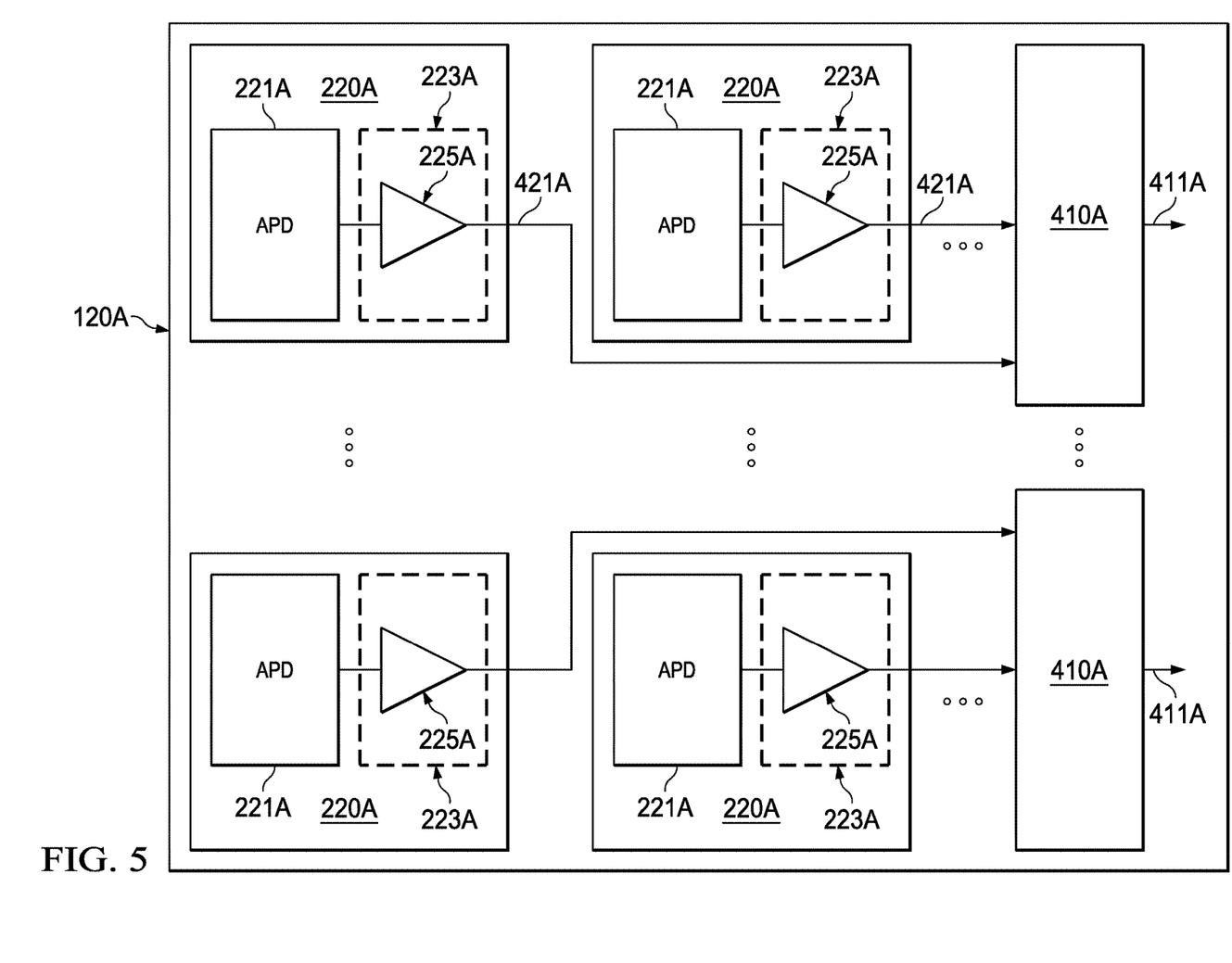
FIG. 5 illustrates another schematic diagram of an example of a sensor chip including circuits in accordance with the disclosure.

FIG. 5 illustrates another schematic diagram of an example of a sensor chip including circuits in accordance with the disclosure. The sensor chip 120a includes several sensor pixels 220a and several out-of-pixel circuits 410a. The sensor pixel 220a includes an APD 221a and an in-pixel circuit 223a coupled to the APD 221a. The in-pixel circuits 223a in each row are coupled to an out-of-pixel circuit 410a, and provides current or voltage outputs of the outputs 421a to out-of-pixel circuit 410a. The in-pixel circuit 223a includes or is an amplifier circuit 225a. In some examples, in each row, the out-of-pixel circuit 410a obtains a total output of current or voltage outputs of the outputs 421a in the respective row, and generates a output signal (such as a voltage) according to the total output of current or voltage outputs of the outputs 421a, and further outputs the output signal via the respective output 411a.

In some examples, the amplifier circuits 225a are transimpedance amplifier (TIA) circuits, the amplifier circuits 225a provide voltage outputs through the outputs 421a, and the out-of-pixel circuit 410a obtains a total output of voltage outputs from the outputs 421a in the respective row. In other examples, the amplifier circuits 225a each includes a combination of transimpedance amplifier circuit and transconductance amplifier circuit, the amplifier circuits 225a provide current outputs through the outputs 421a, and the out-of-pixel circuit 410a obtains a total output of current outputs from the outputs 421a in the respective row. By integration of an APD and an in-pixel circuit (such as a TIA circuit) in pixels of a sensor chip, the interconnect parasitics can be avoided or reduced, and high bandwidth can be obtained.

Figure 6:
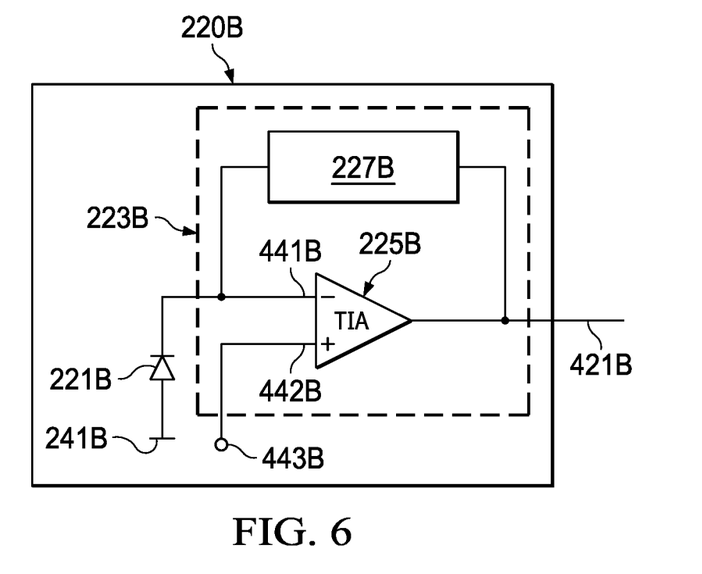
FIG. 6 illustrates another schematic diagram of an example of a sensor pixel of a sensor chip including circuits in accordance with the disclosure.

FIG. 6 illustrates another schematic diagram of an example of a sensor pixel of a sensor chip including circuits in accordance with the disclosure. The sensor pixel 220b includes an APD 221b and an in-pixel circuit 223b coupled to the APD 221b. The in-pixel circuit 223b includes a TIA circuit 225b and a local feedback network 227b. The TIA amplifier 225b receives an current provided by the APD 221b at a first input 441b of the TIA amplifier 225b, and converts the current into an output voltage to an output 421b of the TIA amplifier 225b. In some examples, a second input 442b of the TIA amplifier 225b is coupled to or corresponds to a reference terminal 443b, such as a voltage-reference ($V_{ref}$) terminal. In other examples, the amplifier 225b does not have a voltage-reference input or is not coupled to a voltage-reference ($V_{ref}$) terminal. In some examples, a terminal 241B of the APD 221b is coupled to a voltage supply or voltage generator, such as a negative voltage supply or generator.

The local feedback network 227b couples the output 421b of the TIA amplifier 225b to the first input 441b of the TIA amplifier 225b. The local feedback network 227b may include passive elements (such as one or more resistors, one or more capacitors, one or more inductors) and/or active or nonlinear elements such as one or more transistors.

Figure 7:
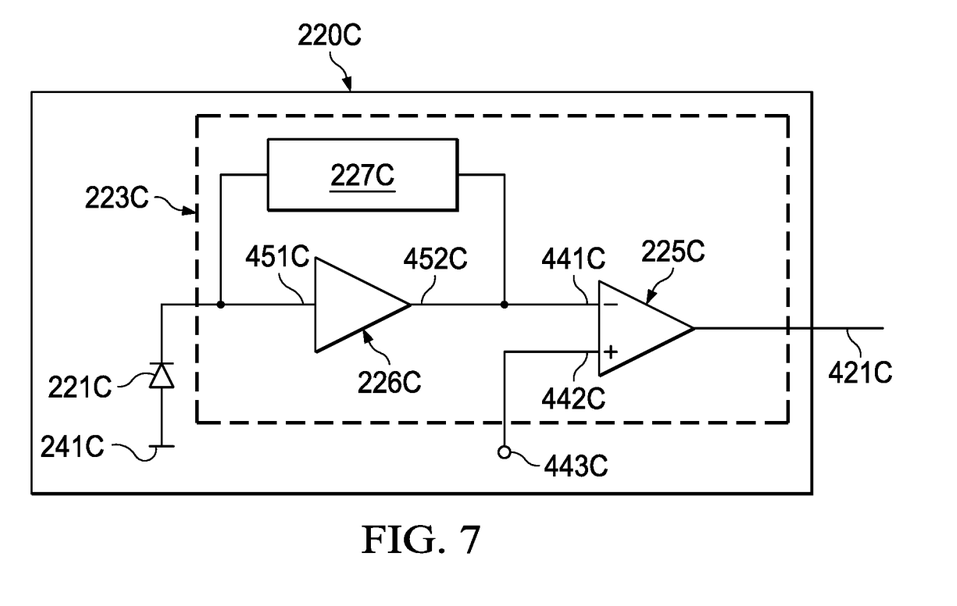
FIG. 7 illustrates another schematic diagram of an example of a sensor pixel of a sensor chip including circuits in accordance with the disclosure.

FIG. 7 illustrates another schematic diagram of an example of a sensor pixel of a sensor chip including circuits in accordance with the disclosure. The sensor pixel 220c includes an APD 221c and an in-pixel circuit 223c coupled to the APD 221c. The in-pixel circuit 223c includes a first amplifier circuit 226c, a second amplifier circuit 225c, and a local feedback network 227c. An output 452c of the first amplifier circuit 226c is coupled to an first input 441C of the second amplifier circuit 225c. An current provided by the APD 221c is received at an input 451c of the first amplifier circuit 226c, and converted into an output voltage to an output 421c of the second amplifier circuit 225c by the first and second amplifier circuits 226c and 225c.

In some examples, a second input 442c of the second amplifier circuit 225c is coupled to or corresponds to a reference terminal 443c, such as a voltage-reference ($V_{ref}$) terminal. In some examples, a terminal 241c of the APD 221c is coupled to a voltage supply or voltage generator, such as a negative voltage supply or generator.

In the example of FIG. 7, the local feedback network 227c couples the output 452c of the first amplifier circuit 226c to the input 451c of the first amplifier circuit 226c. In other examples, the local feedback network 227c couples the output 421c of second amplifier circuit 225c to the input 451c of the first amplifier circuit 226c. The local feedback network 227c may include passive elements (such as one or more resistors, one or more capacitors, one or more inductors) and/or active or nonlinear elements such as one or more transistors.

The APDs of the present disclosure can have deep epitaxial layers (such as deep epitaxial absorption layer) to improve absorbing light and converting to current, a high voltage junction (such as 32V) for avalanche gain, reduced dark current, reduced junction capacitance, and fast transient response. Isolation structures of the present disclosure can shield the in-pixel circuit from the APD in the same pixel and can reduce cross-talk between the APDs in the adjacent sensor pixels.

The lower-voltage circuits (such as TIA circuits) of present disclosure can be integrated with higher-voltage APDs in a same sensor chip by using complementary metal-oxide-semiconductor (COMS) or Bipolar CMOS (BiCMOS) processes with reduced fabrication cost. For example, a lower-voltage circuit (such as a TIA circuit) can be integrated with an APD in a same sensor pixel. Accordingly, the interconnect parasitics, such as bond-wire inductance and electrostatic-discharge (ESD) capacitance, can be reduced or prevented, a bandwidth of the sensing system can be increased (e.g., to above 500 MHz), and sensor noise can be reduced (e.g., to below 2 pA/rtHz). Further, the integrated lower-voltage circuits can have built-in temperature sensing and gain control and built-in overload protection.

The optical sensing system of the present disclosure can include integrated APDs and TIA circuits in a same sensor chip with increased bandwidth (e.g., to above 500 MHz) and a higher SNR and reduced optical and electrical noise. The optical sensing system of the present disclosure can have stable gain over temperature and uniform array performance.

In this description, the term "couple," "couples," or the like means either an indirect or direct wired or wireless connection. Thus, if a first device couples to a second device, that connection may be through a direct connection or through an indirect connection via other devices and connections.

Modifications are possible in the described embodiments, and other embodiments are possible, within the scope of the claims.

What is claimed is:

1. A sensor chip, comprising:
 a sensor pixel including:
  an avalanche photodetector;
  an amplifier and a feedback network proximate the avalanche photodetector, the amplifier having an input and an output, the feedback network coupled between the input and the output, and the input being coupled to the avalanche photodetector; and
  an isolation structure at least partially enclosing the amplifier and being between the avalanche photodetector and the amplifier.

2. The sensor chip of claim 1, wherein:
 the sensor pixel is on a semiconductor substrate; and
 the avalanche photodetector includes a semiconductor junction having a p-type semiconductor layer and an n-type semiconductor layer.

3. The sensor chip of claim 1, wherein the avalanche photodetector is coupled to a contact configured to receive a voltage.

4. The sensor chip of claim 1, wherein the amplifier is coupled to a contact configured to receive a voltage in a range of 1.5 volts to 3.3 volts.

5. The sensor chip of claim 1, wherein the isolation structure includes a base and a wall.

6. The sensor chip of claim 5, wherein a cross-section of the wall across a plane parallel to a substrate of the sensor chip has a diamond shape or a rectangle shape.

7. The sensor chip of claim 5, wherein a cross-section of the wall has a square shape.

8. The sensor chip of claim 1, wherein the isolation structure includes an n-type doped semiconductor layer.

9. The sensor chip of claim 1, wherein the isolation structure is coupled to a ground terminal or a voltage terminal.

10. The sensor chip of claim 1, wherein:
the sensor pixel is a first sensor pixel;
the sensor chip further includes additional sensor pixels; and
a combination of the first and additional sensor pixels forms a sensor array including rows and columns.

11. The sensor chip of claim 10, wherein:
each of the first and additional sensor pixels in the sensor array includes an in-pixel circuit including an amplifier and a feedback network coupled across the amplifier;
the sensor chip further comprises an out-of-pixel circuit outside the sensor array and in the sensor chip; and
in-pixel circuits in a same row are coupled to the out-of-pixel circuit via one or more bus lines.

12. The sensor chip of claim 1, wherein the sensor pixel further includes an optical shield over the amplifier.

13. An optical sensing system comprising:
a sensor chip including a sensor pixel;
an optical signal source for generating optical signals;
a lens for focusing reflected optical signals onto the sensor chip; and
a signal processing module coupled to the sensor chip and the optical signal source;
wherein the sensor pixel includes:
an avalanche photodetector;
an amplifier and a feedback network proximate the avalanche photodetector, wherein the amplifier has an input and an output, the feedback network coupled between the input and the output, and the input is coupled to the avalanche photodetector; and
an isolation structure at least partially enclosing the amplifier and being between the avalanche photodetector and the amplifier.

14. The system of claim 13, wherein:
the sensor pixel is on a semiconductor substrate; and
the avalanche photodetector includes a semiconductor junction having a p-type semiconductor layer and an n-type semiconductor layer.

15. The system of claim 13, wherein the avalanche photodetector is coupled to a contact configured to receive a voltage.

16. The system of claim 13, wherein the amplifier is coupled to a contact configured to receive a voltage in a range of approximately 1.5 volts to 3.3 volts.

17. The system of claim 13, wherein the isolation structure includes a base and a wall.

18. The system of claim 17, wherein a cross-section of the wall across a plane parallel to a substrate of the sensor chip has a diamond shape or a rectangle shape.

19. The system of claim 18, wherein the cross-section of the wall has a square shape.

20. The system of claim 13, wherein the isolation structure includes an n-type doped semiconductor layer.

21. The system of claim 13, wherein the sensor pixel further includes an optical shield over the amplifier.

22. A sensor chip, comprising:
a sensor array having sensor pixels in multiple columns and multiple rows, wherein each of the sensor pixels includes:
an avalanche photodetector; and
an amplifier and a feedback network proximate the avalanche photodetector, the amplifier having an input and an output, the feedback network coupled between the input and the output, and the input being coupled to the avalanche photodetector; and
an isolation structure at least partially enclosing the amplifier and being between the avalanche photodetector and the amplifier.

* * * * *